United States Patent
Rogers et al.

(10) Patent No.: US 10,410,126 B2
(45) Date of Patent: Sep. 10, 2019

(54) TWO-MODEL RECOMMENDER

(71) Applicant: QUALE LLC, Beavercreek, OH (US)

(72) Inventors: Steven Keith Rogers, Beavercreek, OH (US); Adam Steven Rogers, Beavercreek, OH (US)

(73) Assignee: QUALE LLC, Beavercreek, OH (US)

( * ) Notice: Subject to any disclaimer, the term of this patent is extended or adjusted under 35 U.S.C. 154(b) by 0 days.

(21) Appl. No.: 15/400,151

(22) Filed: Jan. 6, 2017

(65) Prior Publication Data
US 2017/0116534 A1   Apr. 27, 2017

Related U.S. Application Data

(63) Continuation of application No. 14/198,698, filed on Mar. 6, 2014, now Pat. No. 9,547,829.

(51) Int. Cl.
*G06N 5/04* (2006.01)
*G06F 17/50* (2006.01)
*G06N 20/00* (2019.01)

(52) U.S. Cl.
CPC ........... *G06N 5/04* (2013.01); *G06F 17/5009* (2013.01); *G06N 20/00* (2019.01)

(58) Field of Classification Search
CPC ...................................................... G06N 5/04
See application file for complete search history.

(56) References Cited

U.S. PATENT DOCUMENTS

| | | |
|---|---|---|
| 5,650,766 A | 7/1997 | Burgmann |
| 8,290,227 B2 | 10/2012 | Chen et al. |
| 8,515,900 B2 | 8/2013 | Flinn et al. |
| 8,589,367 B2 | 11/2013 | Sighart et al. |

(Continued)

FOREIGN PATENT DOCUMENTS

| | | |
|---|---|---|
| EP | 1783632 B1 | 12/2012 |
| WO | 2007062034 A2 | 5/2007 |

(Continued)

OTHER PUBLICATIONS

Reingold, Eyal M. et al.; "Gaze-Contingent Multiresolutional Displays: An Integrative Review", Human Factors, vol. 45, No. 2, Summer 2003.

(Continued)

*Primary Examiner* — Scott A. Waldron
*Assistant Examiner* — Kevin W Figueroa
(74) *Attorney, Agent, or Firm* — Thomas E. Lees, LLC

(57) ABSTRACT

A process for recommending choices to a user uses a first model representing the user's subconscious and a second model representing the user's consciousness. The process comprises receiving data and performing, using the second model, a simulation by modeling the user and a third party to derive a simulation result that determines how the user would react to a situation based at least in part on the received data. Using the first model and the simulation, a first set of recommendation choices based at least in part on the received data is derived, and a set of recommendation choices for presentation based on the first set of recommendation choices is determined and presented to the user. As the user is making a selection, the user is monitored for conscious decisions and subconscious reactions, which are used to update the first model and the second model.

15 Claims, 4 Drawing Sheets

(56) References Cited

U.S. PATENT DOCUMENTS

| | | | |
|---|---|---|---|
| 2002/0116291 A1 | 8/2002 | Grasso et al. | |
| 2012/0036523 A1* | 2/2012 | Weintraub | H04N 7/173 |
| | | | 725/9 |
| 2012/0131034 A1 | 5/2012 | Kenedy et al. | |
| 2012/0331386 A1 | 12/2012 | Hicken et al. | |
| 2013/0287313 A1 | 10/2013 | Marchessoux et al. | |
| 2015/0187024 A1* | 7/2015 | Karatzoglou | G06Q 30/0201 |
| | | | 705/319 |
| 2016/0321736 A1* | 11/2016 | Andersen | G06Q 30/0631 |

FOREIGN PATENT DOCUMENTS

| | | | | |
|---|---|---|---|---|
| WO | WO 2007062034 A2 * | 5/2007 | | G09B 19/0092 |
| WO | 2013154467 A1 | 10/2013 | | |

OTHER PUBLICATIONS

Evans, Jonathan St. B.T. et al.; "Dual-Process Theories of Higher Cognition: Advancing the Debate", Association for Psychological Science, Sage Publications, 2013.

Larue, Othalia et al.; "The emergence of (artificial) emotions from cognitive and neurological processes", Biologically Inspired Cognitive Architectures (2013), vol. 4, pp. 54-68.

Larue, Othalia et al.; "Hypothetical-thinking based on cognitive decoupling and thinking dispositions in a dual cognitive agent", Biologically Inspired Cognitive Architectures (2013) vol. 6, pp. 67-75.

Tourassi, Georgia D. et al.; "Exploring the potential of context-sensitive CADe in screening mammography", Medical Physics, Nov. 2010, vol. 37, issue 11, pp. 5728-5736.

Hammond, Kenneth R. et al.; "Direct Comparison of the Efficacy of Intuitive and Analytical Cognition in Expert Judgment", IEEE Transactions on Systems, Man, and Cybernetics, vol. SMC-17, No. 5, Sep./Oct. 1987.

Acker, Felix; "New findings on unconscious versus conscious thought in decision making: additional empirical data and meta-analysis", Judgment and Decision Making, vol. 3, No. 4, Apr. 2008, pp. 292-303.

* cited by examiner

TWO-MODEL RECOMMENDER

CROSS REFERENCE TO RELATED APPLICATIONS

This application is a continuation of U.S. patent application Ser. No. 14/198,698, filed Mar. 6, 2014, entitled "TWO-MODEL RECOMMENDER", now allowed, the disclosure of which is hereby incorporated by reference.

BACKGROUND

Various aspects of the present invention relate generally to recommender systems and specifically to model-based recommender systems.

Recommender systems are a subclass of information filtering systems that predict a reaction a user will have to specific data. Recommender systems have become increasingly common in recent years, and are applied in a variety of applications. For instance, recommender systems have been used for movies, music, news, books, research articles, search queries, social tags, and products sold over the Internet. Other examples include recommender systems for experts, jokes, restaurants, financial services, life insurance, and online dating.

BRIEF SUMMARY

According to aspects of the present invention, a process for recommending choices to a user uses a first model representing the user's subconscious and a second model representing the user's consciousness. The process comprises receiving data and performing, using the second model, a simulation by modeling the user and a third party to derive a simulation result that determines how the user would react to a situation based at least in part on the received data. Using the first model and the simulation, a first set of recommendation choices based at least in part on the received data is derived, and a set of recommendation choices for presentation based on the first set of recommendation choices is determined and presented to the user.

The process further comprises monitoring a conscious decision made by the user and monitoring subconscious reactions of the user. The subconscious reactions of the user are monitored both while the user is making the selection and not making the selection, and data representing the subconscious reactions of the user is appended to a first memory space. To monitor the conscious decision made by the user, a selection from the set of recommendation choices for presentation performed by the user is received and what the user did not select from the set of recommendation choices for presentation by the user is monitored. Data representing the conscious decisions of the user is appended to a second memory space. The data representing the conscious decisions of the user and the data representing the subconscious reactions of the user is used to update one or both of the models.

According to aspects of the present disclosure, the process may determine recommendation choices for presentation by determining a second set of recommendation choices and blending the first set of recommendation choices with the second set of recommendation choices by vetoing the second set of recommendation choices such that the set of recommendation choices for presentation is identical to the first set of recommendation choices.

According to further aspects of the present disclosure, a process for recommending choices to a user comprises receiving data in response to a user interacting with a recommender system. A first model uses the received data to derive a first set of recommendation choices, and a second model also uses the received data to derive a second set of recommendation choices. A blending function blends the first set of recommendation and the second set of recommendation choices to create a third set of recommendation choices that are arranged in an order. The third set of recommendation choices are presented to the user, and both conscious decisions and subconscious reactions of the user are monitored. At least one of the models is updated based upon information from at least one of the monitored conscious decision and the monitored subconscious reaction.

According to more aspects of the present disclosure, monitoring a subconscious reaction of the user includes monitoring a subconscious reaction of the user to determine an emotional state of the user by using neither invasive sensors nor non-invasive sensors.

DETAILED DESCRIPTION

According to aspects of the present disclosure, a method for recommending data (and an order for that data) to be presented to a user is disclosed. Briefly, the method uses a two-model approach that models the user's intuition and the user's analytic processes in respect to data. The results of these two, independent models are then blended with a blending function to set an order to present the data to the user.

Figure 1:
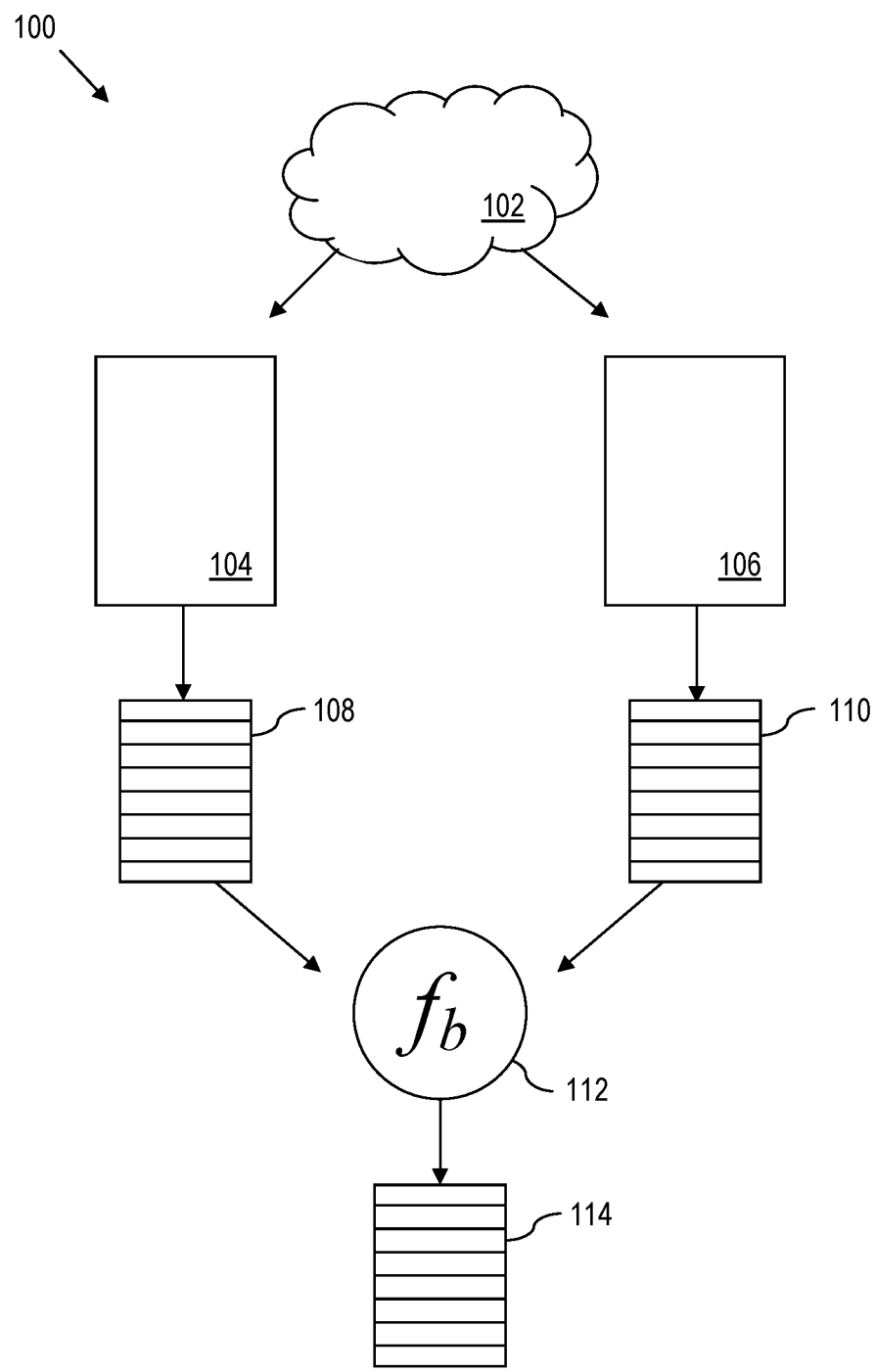
FIG. 1 is a block diagram illustrating a recommender system, according to various aspects of the present disclosure.

Referring now to the drawings and in particular to FIG. 1, a block diagram of a recommender system 100 is shown. Data 102 feeds a first model 104 and a second model 106. The first model 104 is a model of a user's intuition and may be trained by running through the methods of FIGS. 2-3 described below. In an exemplary implementation, the first model 104 may be implemented on an artificial neural network. However, the first model 104 may be implemented in other ways (e.g., using fuzzy logic, using statistical pattern recognition, etc.). The first model 104 derives a first set of recommendation choices 108, which are provided in a specific order based on the data 102. For example, if the data 102 includes A-Z, then the first set of recommendation choices 108 could be E, S, R, A, and H. The resulting first set of recommendation choices 108 may be smaller than, larger than, or equal to the data 102.

Moreover, in an application as a recommender, the data 102 may comprise choices in a certain domain available to the user. Accordingly, the first model 104 may evaluate data 102 to order the choices. Here, since the initial data 102 or a subset thereof will ultimately be presented to the user, the resulting set of recommendation choices 108 will be comprised of the choices or a subset thereof. However, in other applications, the data 102 may not be in a format that directly translates to the first set of recommendation choices 108. For instance, the first model 104 may be required to perform computations, extractions or other manipulations to transform the data 102 into the necessary inputs required by the particular implementation of the model.

The second model 106 is a model of a user's analytic process and may be trained by running through the methods of FIGS. 2-3 below. As with the first model 104, the second model 106 may be implemented on an artificial neural network. Alternatively, the second model 106 may be implemented in other ways (e.g., using fuzzy logic, using statistical pattern recognition, etc.). The second model 106 derives a second set of recommendation choices 110, which are provided in a specific order based on the data 102. For example, if the data 102 includes A-Z, then the second set of recommendation choices 110 could be Z, R, B, and T. The resulting second set of recommendation choices 110 may be smaller than, larger than, or equal to the data 102 in a manner analogous to that described above for the first model 104. Note that the second model 106 is independent of the first model 104, so the number of choices in the second set of recommendation choices 110 does not necessarily need to be the same as the number of choices in the first set of recommendation choices 108.

In other applications, the data 102 may not be in a format that directly translates to the second set of recommendation choices 110. For instance, the second model 106 may be required to perform computations, extractions or other manipulations to transform the data 102 into the necessary inputs required by the particular implementation of the model.

The two derived sets of recommendation choices 108, 110 are blended together using a blending function (*f*b) 112 to create a third set of recommendation choices 114, which are provided in a specific order. The blending function 112 can use any number of approaches to blending. Moreover, the blending function 112 may dynamically change the implemented approach to blending based upon predetermined conditions, which may be derived from the data 102 itself (e.g., the domain of the data), from environmental conditions, from monitored conditions, events, etc. For example, using the two sets of recommendation choices above, inputs and variables into the blending function may determine that more emphasis should be placed on one or more recommendation choices within the first set of recommendation choices 108 than the second set of recommendation choices 110. As such, the blending function weighs the first set of recommendation choices 108 (or a subset thereof) higher than the second set of recommendation choices 110. As a result, the third set of recommendation choices 114 may look like this: E, R, S, Z, A, and B. As indicated by the example, the number of choices in the third set of recommendation choices 114 may be different (more or less) than or the same as the number of choices in the first or second set of recommendation choices 108, 110.

As another example, using the two sets of recommendation choices 108, 110 above, the blending function 112 may determine that more emphasis should be placed on the first model 104 relative to the second model, irrespective of the number or nature of the choices in the first set of recommendation choices 108 and the second set of recommendation choices 110. In yet another example, the blending function 112 may prioritize R before S because that choice is common to both the first set of recommendation choices 108 and the second set of recommendation choices 110.

The above-examples are merely illustrative and other blending approaches may be implemented by the blending function 112.

The third set of recommendation choices 114, which is ultimately based on the received data 102, is then presented to the user for the user to make a selection.

The recommender system 100 is described above for purposes of clarity as to the relationship between the first model 104, the second model 106, and the blending function 112. In practice, the recommender system 100 may include various forms of feedback, as well as other components, such as one or more data sources to store information regarding a recommendation process, a Graphical User Interface (GUI) to facilitate user interaction, and other features, examples of which are described in greater detail herein.

In practice, the first model 104, the second model 106, and the blending function 112 may be implemented on a processing device such as a server, computer, personal computer, a laptop, a smart phone, a tablet computer, a pervasive computing device, etc. Moreover, the first model 104, the second model 106, and the blending function 112 may be distributed across one or more processing devices. For instance, a user may utilize a client such as a web browser to connect to one or more server computers that execute the first model 104, the second model 106, and the blending function 112. Moreover, in alternative implementations, the first model 104, the second model 106, and the blending function 112 may be implemented locally, along with a user interface on a user's processing device (e.g., a smartphone, computer, etc.).

Figure 2:
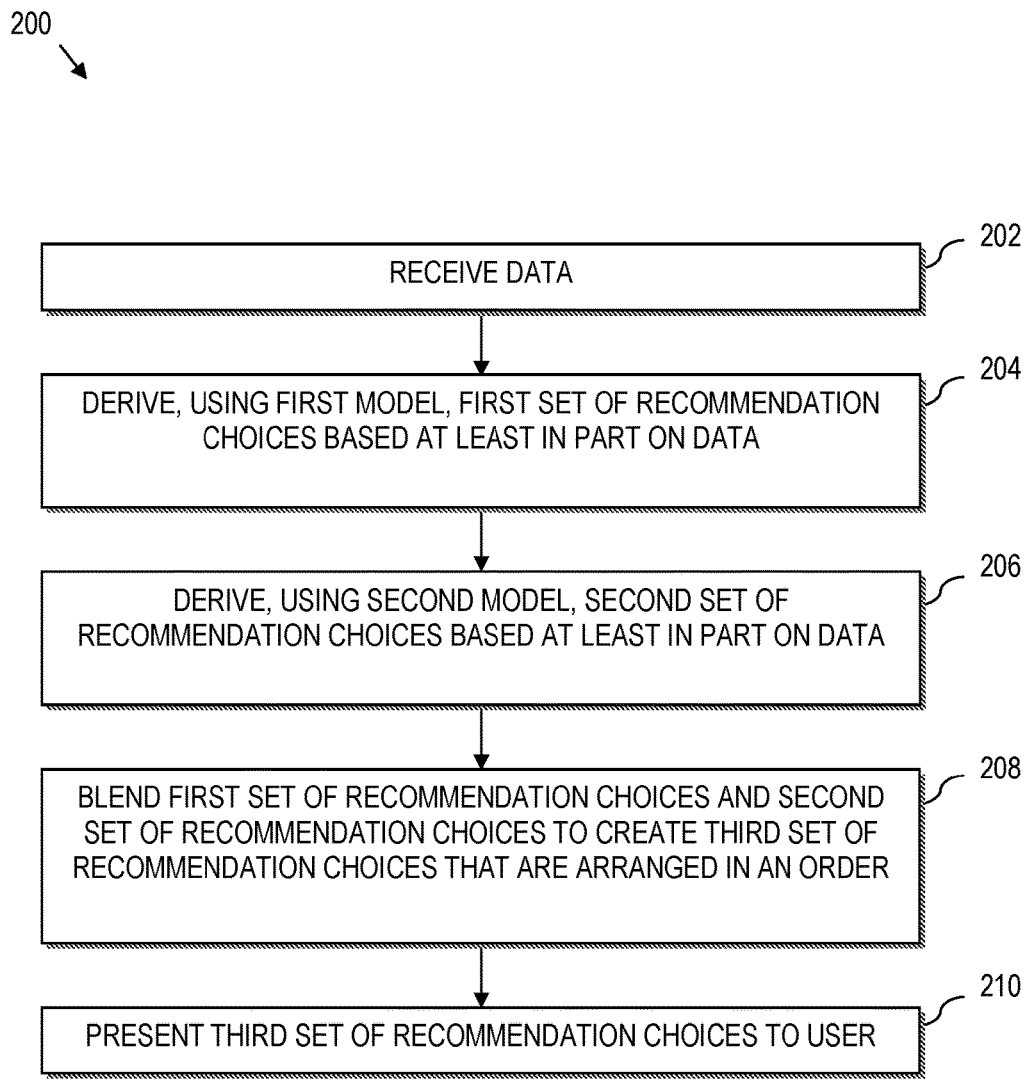
FIG. 2 is a flow chart illustrating a method for making a recommendation to a user, according to various aspects of the present disclosure.

Referring now to FIG. 2, a flow chart illustrating a method 200 for recommending choices to a user is shown. The method 200 may utilize the structures and features described with regard to the recommender system of FIG. 1. In this regard, the method 200 may be implemented as computer-readable hardware that stores machine-executable program code, where the program code instructs a processor to implement the described method, thus making the computer-readable hardware a special purpose machine. The method 200 may also be executed by a processor coupled to a memory such that the processor is programmed to perform the described method.

At 202, data is received. The nature of the data will likely depend on a specific application to which the method is applied. As such, the data can be any type of data from any domain. For example, the data may be a list of potential exercises and diet plans that a person can use to lose weight or maintain a healthy weight (i.e., a weight/health domain). Other examples of data can be a list of songs (i.e., musical domain) or a medical image (e.g., a magnetic resonance imaging (MM) scan) (i.e., medical image domain), an inventory of products (i.e., product domain), etc.

At 204, a first set of recommendation choices is derived using a first model based at least in part on the data. As mentioned above with reference to FIG. 1, the first model models the user's intuitive process. Further, the first set of recommendation choices may be derived from not only the subconscious reactions of the user but may also be further based on conscious decisions of the user.

For example, deriving, using the first model at 204 may include taking measurements of the data (e.g., part of a medical image, acoustic features from a recording of a song, features extracted from a picture or video of a potential date from a dating website, etc.) and learning a mapping of the measurements of the data to subconscious reactions of the user to estimate an amount of arousal (i.e., how calm or excited the user is) and an amount of valence (i.e., the attractiveness or repulsion) the user has for the given data. As such, the first model can be used to process subsequent data to predict what sort of subconscious response the user may have for never-before experienced data, which can be used to rank potential recommendations. In other words, the recommender answers, based on the intuition model (i.e., the first model), "Does the user feel more strongly (i.e., more arousal) about this possible choice in the list versus a next choice in the list," and similarly, "Does the user have more positive feelings (i.e., more valence) about this possible choice in the list versus a next choice in the list."

The training/development of the first model, which models the user's subconscious process, is discussed below in greater detail in reference to FIG. 3.

At 206, a second set of recommendation choices is derived using a second model based at least in part on the data. Basically, the second model models the specific user's analytic process. Further, the second set of recommendation choices may be derived from not only the conscious decision of the user but may also be further based on subconscious reactions of the user.

As with the first model, in illustrative implementations, measurements taken from the data are mapped to observables. In the case of the second model, the observables are conscious decisions made by the user (as opposed to the subconscious reactions used in the first model). Conscious decisions may include selections made by the user and conscious deliberations of the user (e.g., what the user says or inputs) while making the decision, after the decision is made, before the decision is made, or combinations thereof. For example, if reviewing a video of a potential date, a user may say, "This woman is beautiful." In another example of a conscious decision, if a user is reviewing an Mri for cancer, the user may type into a computer whether the user thinks a certain region of a medical image includes cancer. Thus, a conscious decision may include a selection made, selections not made, other deliberate actions (e.g., written, spoken, etc.) of the user, and combinations thereof.

This mapping is used to estimate an amount of arousal and an amount of valence the user has for the given data. As such, the second model can be used to process subsequent data to predict what sort of conscious decision the user may have for never-before experienced data, which can be used to rank potential recommendations. As noted below, the effect that the observables have on the first and second models will be different, which results in two separate and independent models.

The training/development of the second model, which models the user's conscious considerations, is discussed below in greater detail in reference to FIG. 3.

In certain applications, the second set of recommendations may be derived by performing a simulation that may utilize the data or a subset thereof. For example, a model of a specific user's analytic process is developed and trained (as described in greater detail below). Assume that the user wants to decide on a restaurant to go to for supper, and that the recommender system has a model of several different restaurants. The model of each restaurant may range from simple to complex, e.g., by modeling any one or more of the restaurant menu, hours of operation, location/proximity to the user, etc. The simulation may also include more detailed elements, such as restaurant aesthetic, server schedule, model of the servers, model of the busy times of the restaurant, etc.). The recommender runs a simulation of the specific user going to each restaurant—almost like a virtual dining experience (of which the user is not necessarily aware). Then, the recommender system will order the second set of recommendation choices depending on how the model of the user "reacts" in the simulation.

In order to fully process a simulation, the recommender system may create a model of one or more third parties (friends, colleagues, family, etc.), a model of the user, and a model of any other features relevant to the simulation (e.g., restaurants, weather conditions, location, time, date, etc.) in a "virtual world" type environment. If the simulation produces a good result for the model of the user, then that situation is placed closer to the top of the second set of recommendation choices.

In this regard, in certain applications, the user is unaware of the simulation. As such, graphically representing the simulation is not necessary. Moreover, the virtualization of a scenario for purposes of recommending can be implemented in a manner that is within the processing capability of the system to run the simulation(s) in near-real time as the user interacts with the recommender system. As such, the "simulation" may be a conceptualization mechanism to order, weight, select, etc., the variables utilized by the first and second models to derive recommendation choices.

At this point, there is a first set of recommendations choices (based on an intuition model) and a second set of recommendation choices (based on an analytic model). At 208, the recommender system blends, using a blending function, the two sets of recommend choices to create a third set of recommendation choices, which are presented in a specific order to the user.

The blending function is based the domain of the data and may use factors (i.e., the context of the user) to determine the way the two sets of recommendation choices are blended. For example, one such factor may be a number of cues (i.e., dimensionality of the inputs) where the blending function places more weight on the first set of recommendation choices (i.e., intuition) when there is a large number of cues (e.g., more than 2-6 cues). In other words, since a person has a limited working memory, the more variables thrown at the person when making a decision, the more that person is likely to rely on intuition. However, the blending function may place more weight on the second set of recommendation choices (i.e., analytic) when there is a smaller number of cues (i.e., variables). For example, if the data domain is a dating service, selecting a date from profiles of potential dates on a website has many cues (e.g., physical characteristics, common interests, affluence, type of childhood, religion, etc.). Therefore, this factor would lean toward placing more weight on the first set of recommendation choices.

Another example of a factor may be the way the cues are measured. The blending function may place more weight on the first set of recommendation choices when a high level of perception (i.e., subjectiveness) is required to measure the cues. Conversely, the blending function may place more weight on the second set of recommendation choices when a high level of objectiveness is required to measure the cues.

A further example of a factor may be redundancy among the cues. As such, the blending function may place more weight on the first set of recommendation choices when a there is a high redundancy among the cues. Conversely, the blending function may place more weight on the second set of recommendation choices when there is a low level of redundancy among the cues.

Another example factor includes a degree of task certainty. The blending function may place more weight on the first set of recommendation choices when a there is a low certainty of the cues. However, the blending function may place more weight on the second set of recommendation choices when there is a high level of certainty of the cues.

If the cues are displayed simultaneously, then the blending function may place more weight on the first set of recommendation choices. However, if the cues are displayed in series, then the blending function may place more weight on the second set of recommendation choices.

Another factor may be a time period for the decision. A shorter the time period results in more weight on the first set of recommendation choices, while a long time period results in more weight on the second set of recommendation choices. In other words, the blending function may place weight on the first set of recommendation choices inversely proportional to the amount of time predicted for the user to make a decision about the data.

The blending function may use one, all, or a combination of the factors above. Moreover, the blending function may also use factors not explicitly discussed herein.

Further, the blending function may be a veto function, where the blending function ignores the first set of recommendation choices (or a subset thereof) entirely. Some blending functions are further based on the user's kith (i.e., familiar friends, neighbors, relatives, valued advisors in the domain in which the decision is being made (e.g., a radiologist in the domain of reading MRI results); a famous musician in the domain of picking a song; etc.). If it is determined that the user depends on guidance from the user's kith, then the recommender system may run the data through models of the user's kith (e.g., first and second models of the user's brother) to determine a weighting of the recommendation choices. A more independent user may have a blending function that does not rely on the user's kith for some recommendations.

At 210, the third set of recommendation choices is presented to the user. As such, the recommender system uses two separate and independent models to create two sets of recommendation choices (and orders for those two sets) and then blends those two sets together to make a third set of recommendation choices in an order for those choices to be presented to the user.

Figure 3:
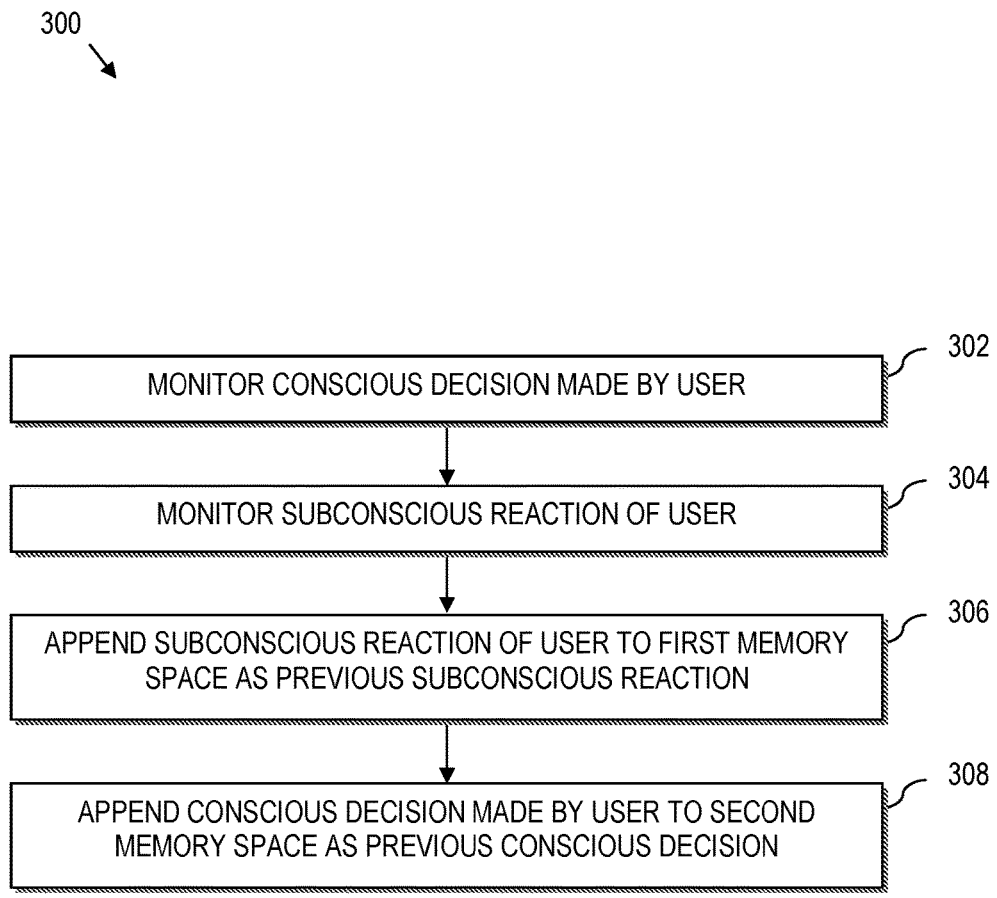
FIG. 3 is a flow chart illustrating a method of training a set of models for the recommendation method of FIG. 1, according to various aspects of the present disclosure.

FIG. 3 is a flow chart illustrating a method 300 for training the first and second models for a specific user. The method starts with a base model for the first model and a base model for the second model. Any base model set may be used. For example, the base models for the first and second models may be an average of all of the users of the system amalgamated into a "generic user." Thus, in the first few presentations of data to the user, the first and second sets of recommendation choices may be further based on previous subconscious reactions and previous conscious decisions of other users. The more that a user uses the recommender system, the more the models will be tuned to that specific user. As such, eventually, the first and second models may not factor in a "generic user" at all. Another base model may be a "factory" model that is blank and does not include any input from any user. Only after the user uses the system do the models get tuned to the specific user. Other base models exist, but each user will eventually have a specific set of models (i.e. a first model and a second model) tuned to that user by monitoring the user while the user is making decisions on the data.

As the set of models are specific to a user, the same set of models may be used with respect to different data. For example, the same set of models may be used when selecting a person from a dating website, when selecting a restaurant at which to dine, when selecting a piece of music, etc. As such, the set of models is unique to the user, not the data. In other words, while mapping the features extracted from the data to the observables (e.g., the conscious decisions and subconscious reactions) may be dependent on the data, the flow from the observables to the sets of recommendation choices may be data independent.

In other implementations, the system may provide a means to train the first model and the second model. For instance, a user may interact with the system outside of the context of a specific recommendation so as to train the models as to baseline characteristics of the user.

At 302, a conscious decision is received from the user and is monitored by the recommender system. Conscious decisions from the user include a selection made by the user. For example, if a list of ten songs is presented to the user, the song that the user selects to be played is a conscious decision. However, conscious decisions also include selections not made by the user. For example, the other nine songs not selected are also conscious decisions. Further, conscious decisions may also include conscious deliberations of the user (e.g., what the user says or inputs) while making the decision. For example, if reviewing a video of a potential date, a user may say, "This woman is beautiful." In another example of a conscious decision, if a user is reviewing an MRI for cancer, the user may type into a computer whether the user thinks a certain region of a medical image includes cancer. Thus, a conscious decision may include a selection made, selections not made, other deliberate actions of the user, and combinations thereof.

The conscious decisions may be monitored and observed by a camera coupled to the recommender system, a mouse, a keyboard, a microphone coupled to the system, non-invasive sensors, any other input device, or combinations thereof.

At 304, a subconscious reaction of the user is monitored, which includes monitoring the user while the conscious decision is made, while the decision is not being made (e.g., before, after, or both), or both. The monitoring includes physiological measurements, affective observables, paralinguistics, or combinations thereof. For example, physiological measurements may include heart rate, skin conductance, skin temperature, pupil dilation, etc. Affective observables include facial expressions, whether or not the user is fidgeting, etc. Paralinguistics include speech rate, speech inflection, volume, the user nodding his/her head, etc. For example, a person who is angry may speak more loudly and at a higher pitch. The monitoring of these observables can be combined to provide insight into the affective state (i.e., emotional state) of the user. To determine these observables (e.g., physiological measurements, affective observables, paralinguistics, or combinations thereof), non-invasive sensors (e.g., visible-light cameras, infrared cameras, thermometers, occulometers, etc.) may be used in order to increase the user's comfort and to provide an ease of use of the system. However, invasive sensors (e.g., electrodes attached to the user) may also be used. Moreover, monitoring the subconscious reaction of the user may also include monitoring the amount of time the user takes to make the conscious decision.

At 306, data representing the subconscious reactions of the user are appended to a first memory space as previous subconscious reactions. There are several ways the reactions may be appended. For example, the reactions may simply be written in a next address of a memory space and then used when one of the models needs to use previous subconscious reactions. As such, the previous subconscious reactions may be used for developing new models or for tuning an existing model. In another example, the subconscious reactions are appended to the first memory space by modifying the first model, second model, or both to reflect the subconscious reaction. As such, each subconscious reaction may change the first model, second model, or both for a next pass of data through the models to create the sets of recommendation choices.

At 308, data representing the conscious decision of the user is appended to a second memory space as previous conscious decision. As with the subconscious reactions at 306, there are several ways the conscious decisions may be appended. For example, the conscious decision may simply be written in a next address of a memory space and then used when one of the models needs to use previous conscious decisions. As such, the previous conscious decisions may be used for developing new models. In another example, the conscious decisions are appended to the second memory space by modifying the first model, second model, or both to reflect the conscious decisions. As such, each conscious decision may change the first model, second model, or both for a next pass of data through the models to create the sets of recommendation choices.

Thus, both the conscious decisions and the subconscious reactions may be used to modify both independent models differently. However, how those reactions and decisions are applied may depend on the factors of the blending function listed above. In the following example, a user is grimacing while making a decision on which piece of music to play and takes a very short time to make the decision. As such, the first model may be modified more heavily than the second model, because a short deliberation time reflects more intuition than analysis (see above). On the other hand, if the user takes a long time to deliberate, then the second model may be modified more heavily than the first model. As such, the context of the user is used to train the set of models for the specific user.

Further, after the decision is made, the user may grimace, which would indicate that the user's selection was not a good one, and the models will be updated accordingly. Another example is that the user may make another decision quickly after the first one, which would indicate dissatisfaction with the original selection, and the models would be updated accordingly.

In order to determine the context, the factors discussed above may be used. Further, the recommender system may look at other external factors for context. Example external factors include determining if the user is in a good mood, if the user is distracted, if the data is in a field that can be handled differently, how the user maintains relationships between concepts, etc. As such, the recommender system may look for connection links between the user's thought processes and the data. For example, one user may see the letter "V" and think of Beethoven's Fifth Symphony ("V" is the Roman numeral for five); another user may see the letter "V" and think of the movie "V for Vendetta"; a third user may see the letter "V," think of "V" for victory, then think of the blitz during World War II, and then think of Edward R. Murrow. As such, the letter "V" means different things to different people—all of which may not actually be present in the data that is to be recommended to the user. As such, these connection links may provide a context used in modifying the set of models and the blending function.

Moreover, connection links are not static. As such, a user's connection links may change over time. For example, a user may have originally associated the actor William Shatner with Captain Kirk from the Star Trek® series. However, later in life, that same user may associate William Shatner with Denny Crane from the television show Boston Legal®. ("Star Trek" is a registered trademark of Paramount Pictures Corporation, a Delaware corporation, 5555 Melrose Avenue, Los Angeles Calif., 90038, and "Boston Legal" is a registered trademark of Twentieth Century Fox Film Corporation, a Delaware corporation, of 10201 West Pico Boulevard, Los Angeles, Calif., 90035.) As such, the connection links are continually revised and provide a great context for the recommender system.

Therefore, these connection links between the conscious decision of the user and the data may be stored in a third memory space as previous connection links. As with the subconscious reactions at 306, there are several ways the connection links may be stored. For example, the connection link may simply be written in a next address of a memory space and then used when one of the models needs to use previous connection links. In another example, the connection links are appended to the third memory space by modifying the first model, second model, or both to reflect the connection links. As such, each connection link may change the first model, second model, or both for a next pass of data through the models to create the sets of recommendation choices.

These connection links may be derived through link games that a user may play in order to help train the set of models. The user may be shown sets of data, and then the user enters the similarity between two sets of data. For example, for a dating website, a user may be shown two pictures of women and asked to enter a similarity between the two pictures. Other examples of link games include the ESP Game and Peekaboom, and similar games where the user is shown an image and the user provides a label for the image. Thus, the connection links are unique to a specific user, just as a set of models is unique to a specific user.

In this regard, depending upon the specific implementation, the first memory space, the second memory space, and the third memory space may be implemented using a database, a table, or other suitable storage structure on a storage device that is accessible by the recommender system.

In some instances, the recommender system will display the third set of recommendation choices to the user and give a reason why the choices are ordered that way (i.e., attribution). This attribution may be based on the previous connection links. In certain implementations, the user can interact with the recommender system based upon the attribution to further tune the models (e.g., by affirming, correcting, indicating error in, or otherwise providing feedback on the accuracy, usefulness, etc.) of the provided attributions.

The recommendation method may be used with any type of data (i.e., within any domain), and the data may be pre-sorted by a third-party. For example, at an online dating site, the online data site may generate an initial set of recommendation choices in an order decided by the dating site and send that initial set to the recommender system (i.e., a system running the recommendation method) as data. Then, the recommender system may pick the top ten potential dates for a user from the initial set provided by the online dating site and order those potential dates in an order that the user would probably choose them.

For example, assume that a user has already set up the first model and second model by playing some "link games" similar to the games mentioned above to create links to tune the first and second models to the user. The user goes to an online dating website and fills out a questionnaire, and based on that questionnaire, the online dating site sends an initial set of ranked recommendation choices to the recommender system. The recommender system extracts features of the data (e.g., images, physical characteristics from text files, demographic information, etc.), which are used as inputs to run the first model. The output of the first model estimates the user's subconscious excitement and valence and outputs a first set of recommendation choices. Likewise, the features of the data are run through the second model to estimate the user's conscious excitement and valence and to output a second set of recommendation choices. (The first model can be run before, after, concurrently with, or combinations thereof the second model.) The recommender system then blends the first set of recommendation choices with the second set of recommendation choices using a blending function. In this case, there are many dimensions of observables and features of the data; as such, the blending function will place more weight on the first set of recommendation choices (i.e., the estimate of the user's subconscious) to create the third set of recommendation choices in a specific order to present to the user.

The recommender system monitors the user as the user deliberates over the profiles. Thus, if the user says, "This one is cute," then a microphone would pick up that conscious decision, turn that speech to text, determine which profile at which the user is looking, and update the second model (and possibly the first model) accordingly. While looking at an image in another profile, the user's pupils may dilate (a sign of attraction) as a subconscious reaction to the data. As such, the recommender system monitors that subconscious reaction, such as with a camera, determines at which profile the user is looking, and updates the first model (and possibly the second model) accordingly. Further, when the user makes a selection, the recommender system monitors which profile was selected while monitoring which profiles were not selected. Again, the monitored selection and non-selections (along with any monitored subconscious reactions of the user) are used to update the models. Moreover, if the user later decides that the wrong profile was chosen, subconscious and conscious observables may be monitored and the first and second models may be updated accordingly.

Another example includes computer-aided detection (CAD) of a feature of interest in data (e.g., cancer in a medical image, a fault in a materials inspection system datafile, detection of malicious computer code within a computer or computer network, etc.), where the method monitors the user while the user makes decisions on whether feature is present in the data. In this example, the method further makes its own evaluation of the data and uses its evaluations, the conscious decisions of the user, and the subconscious reactions of the user to recommend places within the data that the user should double-check. Further, an initial set of recommendations may be created by the computer-aided detection system and sent to the recommender system as the data, but the recommender system changes the order based on the methods described herein before presenting the data to the user.

Yet another example includes recommending a piece of music or playlist, where the recommender recommends music based on the user's previous choices and subconscious reactions to that music. As such, the recommender system disclosed herein may work in conjunction with other third-party recommender systems.

Figure 4:
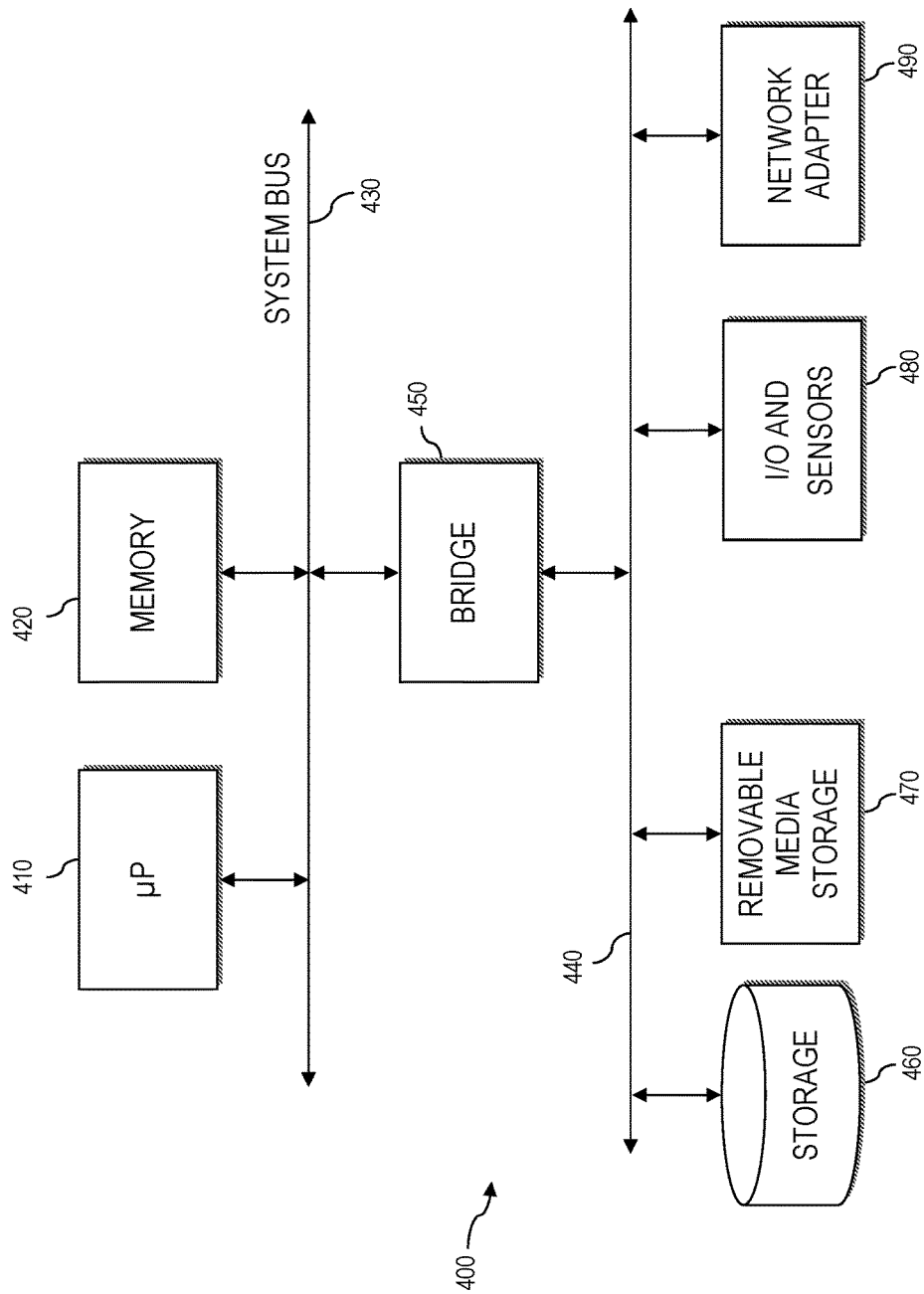
FIG. 4 is a block diagram of a computer system having a computer readable storage medium for implementing functions according to various aspects of the present disclosure as described in greater detail herein.

Referring to FIG. 4, a schematic block diagram illustrates an exemplary computer system 400 for implementing the various methods described herein, e.g., by interacting with a user. The exemplary computer system 400 includes one or more microprocessors (μP) 410 and corresponding memory 420 (e.g., random access memory and/or read only memory) that are connected to a system bus 430. Information can be passed between the system bus 430 and bus 440 by a suitable bridge 450. The bus 440 is used to interface peripherals with the one or more microprocessors (μP) 410, such as storage 460 (e.g., hard disk drives); removable media storage devices 470 (e.g., flash drives, DVD-ROM drives, CD-ROM drives, floppy drives, etc.); I/O devices and sensors 480 (e.g., mouse, keyboard, monitor, printer, scanner, visible-light cameras, infrared cameras, thermometers, occulometers, motion sensors, microphones, other devices discussed with reference to FIGS. 1-3 herein, etc.); and a network adapter 490. The above list of peripherals is presented by way of illustration, and is not intended to be limiting. Other peripheral devices may be suitably integrated into the computer system 400.

The microprocessor(s) 410 control operation of the exemplary computer system 400. Moreover, one or more of the microprocessor(s) 410 execute computer readable code that instructs the microprocessor(s) 410 to implement the methods herein. The computer readable code may be stored for instance, in the memory 420, storage 460, removable media storage device 470 or other suitable tangible storage medium accessible by the microprocessor(s) 410. The memory 420 can also function as a working memory, e.g., to store data, an operating system, etc.

Thus, the exemplary computer system 400 or components thereof can implement methods and computer-readable storage devices as set out in greater detail herein. Other computer configurations may also implement the methods and computer-readable storage devices as set out in greater detail herein. Computer program code for carrying out operations for aspects of the present invention may be written in any combination of one or more programming languages. The program code may execute entirely on the computer system 400, partly on the computer system 400, partly on the computer system 400 and partly on a remote computer or entirely on a remote computer or server. In the latter scenario, the remote computer may be connected to the computer system 400 through any type of network connection, e.g., using the network adapter 490 of the computer system 400.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. Aspects of the invention were chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable storage medium(s) having computer readable program code embodied thereon.

Any combination of one or more computer readable media may be utilized. The computer readable medium may be a computer readable signal medium or a computer readable storage medium. A computer readable storage medium may be, for example, but not limited to, a system, apparatus, or device. The system, apparatus, or device may be electronic, magnetic, optical, electromagnetic, infrared, or semiconductor, or any suitable combination of the foregoing. In the context of this document, a computer readable storage medium may be any tangible medium that can contain, or store a program for use by or in connection with an instruction execution system, apparatus, or device. As such, a computer readable storage medium specifically does not include anything defined as a computer readable signal medium.

A computer readable signal medium is a propagated data signal with computer readable program code embodied therein, for example, in baseband or as part of a carrier wave. Such a propagated signal may take any of a variety of forms, including, but not limited to, electro-magnetic, optical, or any suitable combination thereof.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language and conventional procedural programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. Aspects of the invention were chosen and described in order to best explain the principles of the invention and the practical application, and to enable others of ordinary skill in the art to understand the invention for various embodiments with various modifications as are suited to the particular use contemplated.

What is claimed is:

1. A process for recommending choices to a user, wherein the process uses a first model representing the user's subconscious and a second model representing the user's consciousness, the process comprising:
receiving data;
performing, using the second model, a simulation by modeling the user and a third party to derive a simulation result that determines how the user would react to a situation based at least in part on the received data, wherein the received data feeds the second model;
modifying variables of the first model, based on the simulation results of the second model, to create a modified first model;
deriving, using the modified first model, a first set of recommendation choices based at least in part on the received data, wherein the received data feeds the first model;
determining a set of recommendation choices for presentation based on the first set of recommendation choices;
presenting the set of recommendation choices for presentation to the user;
monitoring a conscious decision made by the user by:
receiving a selection from the set of recommendation choices for presentation performed by the user; and
monitoring what was not selected from the set of recommendation choices for presentation by the user;
monitoring subconscious reactions of the user by:
monitoring a subconscious reaction of the user while the user is performing the selection; and
monitoring a subconscious reaction of the user while the user is not performing the selection;
appending data representing the subconscious reactions of the user to a first memory space as previous subconscious reactions;
appending data representing the conscious decisions of the user to a second memory space as previous conscious decisions; and
updating least one of the first model and the second model, based on at least one of the data representing the conscious decisions of the user and the data representing the subconscious reactions of the user.

2. The process of claim 1, wherein determining a set of recommendation choices for presentation based on the first set of recommendation choices includes:
determining a second set of recommendation choices; and
blending, using a blending function, the first set of recommendation choices and the second set of recommendation choices to create the set of recommendation choices for presentation that are arranged in an order.

3. The process of claim 2, wherein blending, using a blending function, the first set of recommendation choices and the second set of recommendation choices further includes vetoing the second set of recommendation choices such that the set of recommendation choices for presentation is identical to the first set of recommendation choices.

4. The process of claim 1, wherein monitoring the subconscious reaction of the user further includes monitoring reflexive responses of the user including select at least one of:
physiological measurements;
affective observables; and
paralinguistics.

5. The process of claim 1, wherein monitoring the subconscious reaction of the user further includes monitoring the amount of time the user takes to make the selection.

6. The process of claim 1, wherein deriving, using a first model and the simulation, a first set of recommendation choices is further based on the previous conscious decision of the user.

7. The process of claim 1, wherein deriving, using a first model and the simulation, a first set of recommendation choices is further based on the previous subconscious reaction of the user.

8. The process of claim 1, wherein deriving, using a first model and the simulation, a first set of recommendation choices is further based on the previous subconscious reaction of the user and the previous conscious decision of the user.

9. The process of claim 1, wherein modeling the third party includes modeling the user's friends.

10. The process of claim 1, wherein modeling the third party includes modeling the user's colleagues.

11. The process of claim 1, wherein deriving a first set of recommendation choices is further based upon previous subconscious reactions from people other than the user.

12. The process of claim 1, wherein updating at least one of the first model and the second model, based on at least one of the data representing the conscious decisions of the user and the data representing the subconscious reactions of the user includes updating the first model based upon information from the first memory space.

13. The process of claim 1, wherein updating at least one of the first model and the second model, based on at least one of the data representing the conscious decisions of the user and the data representing the subconscious reactions of the user includes updating the first model based upon information from the second memory space.

14. The process of claim 1, wherein updating at least one of the first model and the second model, based on at least one of the data representing the conscious decisions of the user and the data representing the subconscious reactions of the user includes updating the second model based upon information from the first memory space.

15. The process of claim 1, wherein updating at least one of the first model and the second model, based on at least one of the data representing the conscious decisions of the user and the data representing the subconscious reactions of the user includes updating the second model based upon information from the second memory space.

* * * * *